United States Patent [19]

Armstrong

[11] Patent Number: 5,461,908
[45] Date of Patent: Oct. 31, 1995

[54] AUTOMATIVE DIAGNOSTIC TESTING APPARATUS

[75] Inventor: Richard W. Armstrong, O'Fallon, Ill.

[73] Assignee: ABE Electronics, Inc., St. Louis, Mo.

[21] Appl. No.: 269,828

[22] Filed: Jul. 1, 1994

Related U.S. Application Data

[62] Division of Ser. No. 139,558, Oct. 20, 1993, Pat. No. 5,369,991, which is a continuation of Ser. No. 859,091, Mar. 27, 1992, abandoned.

[51] Int. Cl.$^6$ ................................................. G01M 19/00
[52] U.S. Cl. ............................................ 73/118.1; 324/503
[58] Field of Search ......................... 73/118.1; 324/772, 324/503, 555; 340/648

[56] References Cited

U.S. PATENT DOCUMENTS

| | | | |
|---|---|---|---|
| 3,875,792 | 4/1975 | Krohn et al. | 73/119 A |
| 3,919,885 | 11/1975 | Kaireit | 73/119 A |
| 3,940,977 | 3/1976 | Voross et al. | 73/116 |
| 4,079,310 | 4/1978 | Ortmann | 324/15 |
| 4,246,566 | 1/1981 | Endo et al. | 340/52 F |
| 4,274,144 | 6/1981 | Meyer et al. | 364/551 |
| 4,300,205 | 11/1981 | Tansuwan | 364/578 |
| 4,315,243 | 2/1982 | Calvert, Sr. | 340/52 R |
| 4,402,217 | 9/1983 | Higashiyama | 73/117.3 |
| 4,499,876 | 2/1985 | Yamamoto | 123/481 |
| 4,523,458 | 6/1985 | Daniel | 73/119 A |
| 4,527,424 | 7/1985 | Takahashi | 73/119 A |
| 4,557,141 | 12/1985 | Poirier et al. | 73/117.2 |
| 4,567,756 | 2/1986 | Colborn | 73/118 |
| 4,644,284 | 2/1987 | Friedline et al. | 324/397 |
| 4,756,186 | 7/1988 | Sangawa | 73/119 A |
| 4,764,727 | 8/1988 | McConchie, Sr. | 324/503 |
| 4,788,858 | 12/1988 | Liebermann | 73/119 A |
| 4,798,084 | 1/1989 | Takahashi et al. | 73/119 A |
| 4,831,560 | 5/1989 | Zaleski | 364/551.01 |
| 4,841,765 | 6/1989 | Blanke | 73/119 A |
| 4,945,760 | 8/1990 | Hornung | 73/118.1 |
| 4,975,846 | 12/1990 | Abe et al. | 364/424 |
| 4,975,847 | 12/1990 | Abe et al. | 364/424 |
| 4,975,848 | 12/1990 | Abe et al. | 364/424 |
| 5,031,595 | 7/1991 | Heck et al. | 123/339 |
| 5,107,701 | 4/1992 | Smith | 73/119 A |
| 5,124,919 | 6/1992 | Kastelle | 73/118.1 |
| 5,130,657 | 7/1992 | Hornung | 73/118.1 |

OTHER PUBLICATIONS

Alltest Reference Guide to Alltest Professional Diagnostic and Test Equipment; Alltest; 1987; Form No. AL–211–87.
Alltest Model 3258 Brainmaster II; Alltest; 1988; Form No. 009–88.
Diagnostic Equipment pp. 26–37.

*Primary Examiner*—Robert Raevis
*Attorney, Agent, or Firm*—Richard G. Heywood

[57] ABSTRACT

A diagnostic testing apparatus for testing an automotive IAC motor normally controlled by pulse signals from the electronic control module (ECM) of an automotive electrical system, which apparatus is coupled between the ECM and the IAC motor circuits and provides first circuits re-establishing a normal signalling communication therebetween, and second circuits comprising parallel test circuits including indicators and switches constructed and arranged for indicating faults in the component.

10 Claims, 2 Drawing Sheets

AUTOMATIVE DIAGNOSTIC TESTING APPARATUS

This application is a division of U.S. patent application Ser. No. 08/139,558 filed Oct. 20, 1993 (now U.S. Pat. No. 5,369,991) which in turn is a continuation of U.S. patent application Ser. No. 07/859,091 filed Mar. 27, 1992 (now abandoned).

BACKGROUND OF THE INVENTION

1. Field of the Invention

This invention generally relates to automotive electrical and control systems, and more specifically to diagnostic testing apparatus for testing the integrity of electrical components and circuits in the automotive field.

2. Prior Art

Automotive electrical systems and microprocessor and other "intelligent" controls therefor have become increasingly complex through recent years. In today's modern car an electrical control module (ECM) constitutes the center of operation and typically is programmed to control the variety of electrical components in the automotive electrical system. The ECM receives input signals or parameters from various sensors and/or switches including vehicle speed, transmission/transaxle gear indication, time, throttle position, park/neutral mode, manifold absolute pressure, system voltage, exhaust oxygen content, engine detonation, engine cranking mode, engine crankshaft position, engine coolant temperature, barometric pressure, and air conditioning system engagement. The ECM continually monitors this input information and produces output commands based on logic analysis to control the operation of various electrical components, which include the idle air control (IAC) motor, sequential fuel injectors (SFI), electric fuel pump, air conditioner compressor clutch, engine cooling fan control, electronic spark timing, air control valve, air switching valve, canister purge control valve, exhaust gas recirculation control, transmission/transaxle torque converter clutch and air door control.

Automotive diagnostic equipment and systems have followed the same trend as electrical systems per se and have become quite sophisticated, complex and expensive. In fact, it is believed that automobile manufacturers traditionally prefer and authorize the use of complex diagnostic equipment that generally can only be afforded by "authorized" factory service departments, particularly since the software programs of such testing equipment are designed for the ECM and electrical systems of that manufacturer's automobiles. Thus, other than conventional ammeter and like continuity testers, there has been no good, inexpensive and universal diagnostic tester available to both skilled and unskilled automotive mechanics for testing the integrity of many electrical components controlled by the electronic control module (ECM) of various automotive systems so that there can be a reliable and simple diagnosis of faults for repair.

It is also known that prior automotive diagnostic equipment has been designed to test different electrical system components normally controlled by the ECM, but such components are generally not tested under actual operating conditions. Instead, the component is usually isolated from the ECM circuitry and the test equipment inputs its own pulse train signals. In other words, the operator may be unable to determine the source or nature of a fault because the ECM is no longer controlling the component. If the ECM is not "live" in the circuit, the test results cannot accurately determine whether the component is receiving proper pulsing signals or is faulty per se.

SUMMARY OF THE INVENTION

The present invention is embodied in a diagnostic testing apparatus for testing the integrity of an electrically operated component normally controlled by the electronic control module (ECM) of the automotive electrical system, in which the testing apparatus is interposed between the ECM and the component to be tested and includes a series ECM circuit for control signals to the component, and a testing circuit constructed and arranged for indicating faults in the function of the component.

It is an object of the present invention to provide a diagnostic testing apparatus for simply, quickly and efficiently diagnosing faults in the control circuit and operation of electrical automotive components; to provide an inexpensive, effective testing device that will indicate the integrity of an electrical automotive component; to provide an automotive diagnostic tool that can be quickly coupled between an ECM and an electrical component to be tested and will show the relative operativeness of the component; to provide a simple diagnostic device that can be used by both trained and "backyard" mechanics. These and still other objects and advantages will become more apparent hereinafter.

BRIEF DESCRIPTION OF THE DRAWINGS

In the accompanying drawings which form a part of the specification and wherein like numerals refer to like parts wherever they occur.

DETAILED DESCRIPTION OF THE PREFERRED EMBODIMENTS

Figure 1:
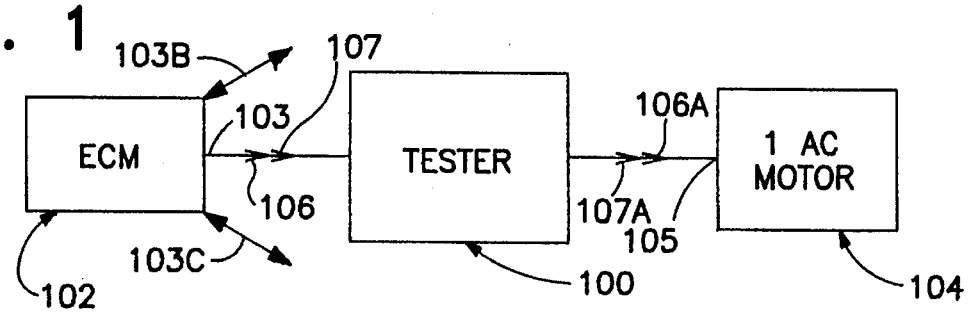
FIG. 1 is a block diagram of one embodiment of an automotive diagnostic apparatus according to the invention for testing an idle air control (IAC) motor.
Figure 2:
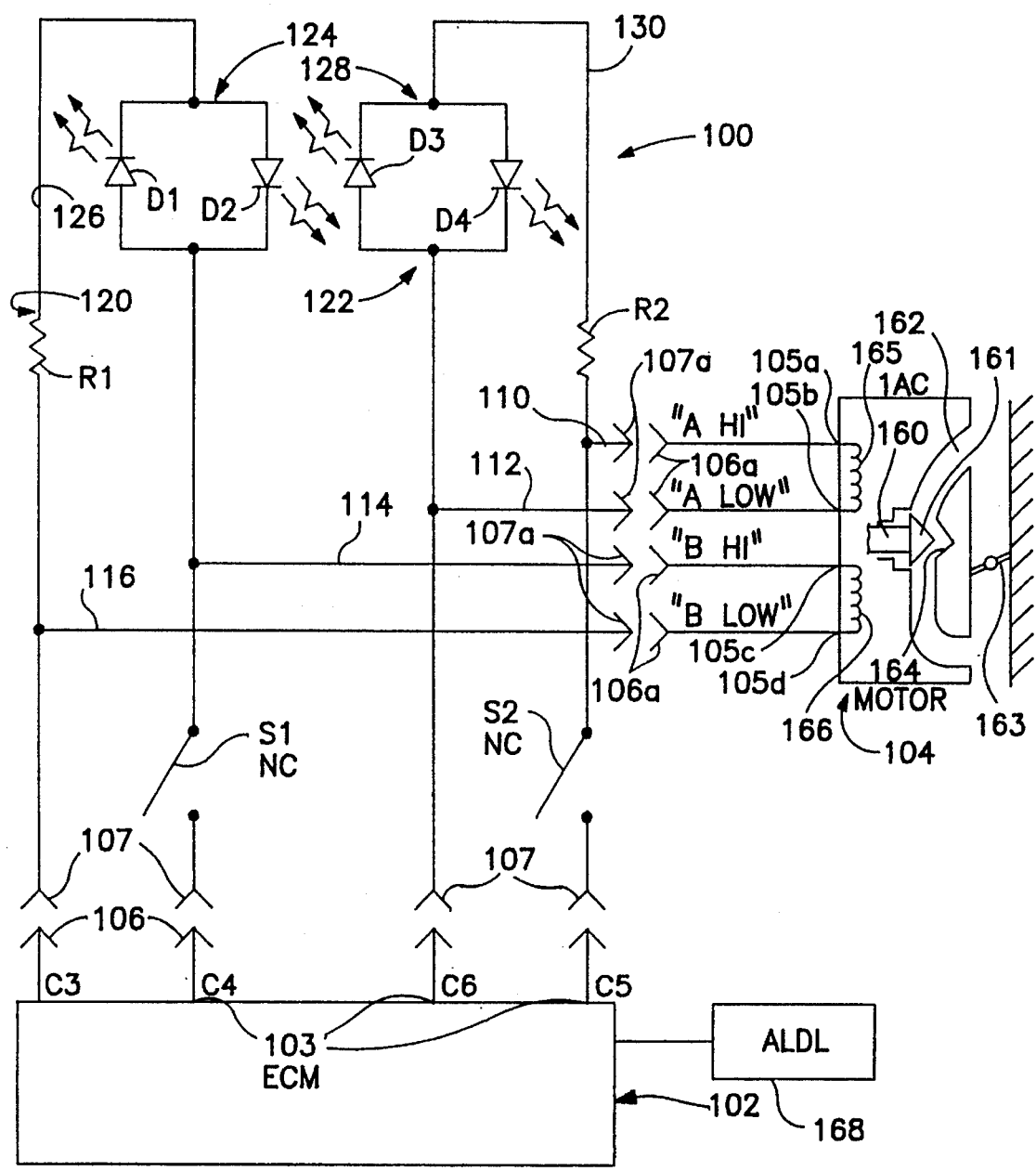
FIG. 2 is a schematic diagram of the diagnostic apparatus embodiment of FIG. 1 for testing the idle air control motor.
Figure 3:
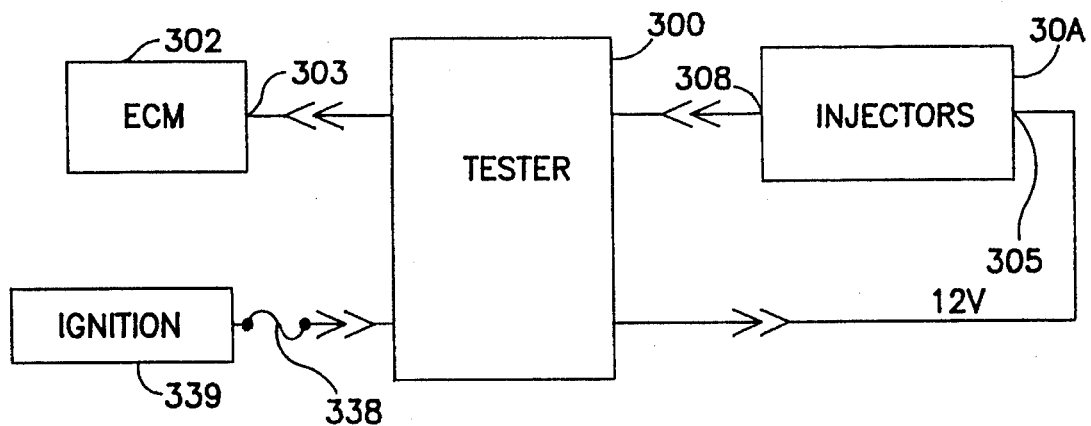
FIG. 3 is a block diagram of another embodiment of an automotive diagnostic apparatus according to the invention for testing a sequential fuel injector power balance.
Figure 4:
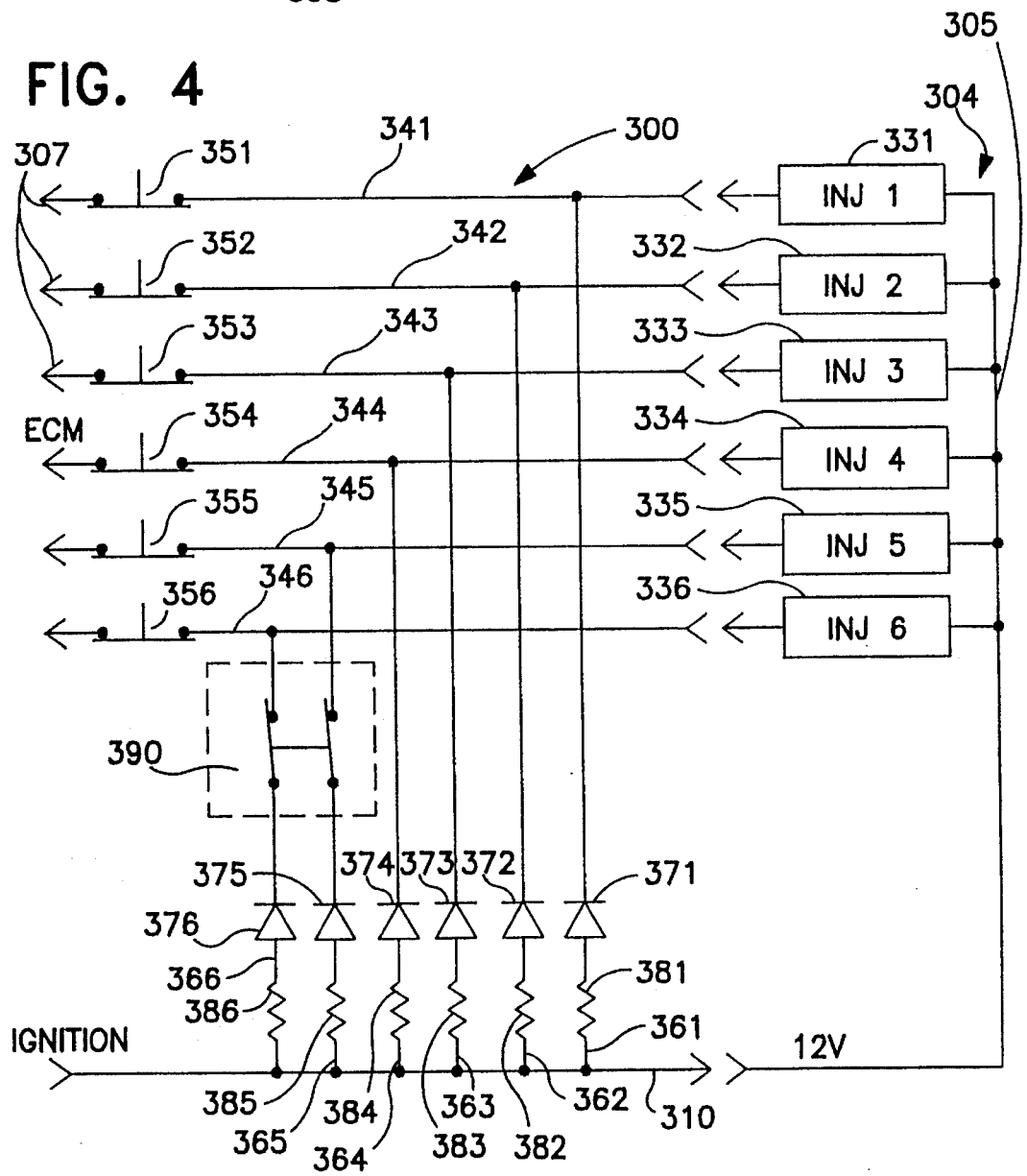
FIG. 4 is a schematic diagram of the diagnostic apparatus embodiment of FIG. 3 for testing the sequential fuel injector power balance.

Diagnostic testing apparatus embodying the invention is useful in testing electrical components operated by an electronic control module (ECM) in automotive electrical systems. For disclosure purposes, one embodiment of the diagnostic tester 100 is illustrated in FIGS. 1 and 2 for testing the integrity of an idle air control (IAC) motor as the electrical component 104 normally controlled by the ECM 102. Another embodiment of the diagnostic tester (300) is illustrated in FIGS. 3 and 4 for testing the integrity of a sequential fuel injection system 304 also controlled by the ECM, as will appear.

Referring specifically to FIG. 1, a diagnostic apparatus 100 embodying the invention is shown interposed between an output 103 of the ECM 102 and inputs 105 to the IAC motor 104. In the automotive electrical system per se (not shown), output 103 is connected directly to input 105 by a conventional multi-plug harness or couplers 106, 106A for normal automotive operation, and other ECM outputs 103B, 103C are directly coupled to other electrical components as will appear. The testing apparatus 100 of the present invention also has conventional couplers 107, 107A adapted to be separably connected in series between the ECM output coupler 106 and the IAC motor coupler 106A for testing and indicating faulty operation of the idle air control (IAC) motor 104. The IAC motor 104 is normally operated (by a pulse series from the ECM 102 in response to sensed engine conditions) to regulate or adjust engine idle speed and to prevent stalling due to increased engine load at idle.

Although the construction and operation of the IAC motor is well known, the following brief description is given in the reference to FIG. 2 for environmental purposes. The IAC motor 104 is a reversible "stepper" motor that reacts to power pulses or signals from the ECM 102 to cause an IAC armature 160 to move in a series of steps in either direction. Each pulse causes the armature 160 to step in a rotational movement a predetermined amount, such as 60°, to cause the IAC valve 161 on the armature to open or close to regulate bypass air flow (162) around the fuel mix/air throttle plate 163, which is normally closed during engine idle. The volume of bypass air determines idle speed, and the proper position of the valve 161 (i.e. the amount of air allowed to bypass the throttle plate 163) as determined by the ECM 102 is based upon battery voltage, coolant temperature, mass air flow, throttle position sensor, engine speed, a/c clutch signal, power steering pressure switch, and engine intake air temperature. In this way, the ECM 102 can regulate idle speed in accordance with the rpm signal received from the electronic timing module. If the ECM 102 senses a low rpm, then to prevent an engine stall condition it compensates by pulsing to open the IAC valve 161 and increase the bypass air flow past the throttle plate 163 thereby increasing idle speed. To reduce idle speed, the ECM 102 sends pulses to the IAC that cause its armature 160 to extend and move the valve toward its seat 164. This reduces the amount of air allowed to bypass the throttle plate, which reduces idle speed. When the ignition is turned off, the ECM 102 resets the IAC motor to a predetermined position correlating to "fast idle" for restart by issuing enough pulses to position the IAC valve 161. This position is used by the ECM 102 as a reference point. The next time the engine is started, the ECM 102 counts the number of pulses needed to attain the correct idle speed. In this way, the ECM 102 "learns" the IAC motor position for a specified idle speed. In short, the idle speed of IAC motor 104 is varied in response to a number of pulse train signals generated by the ECM 102.

The IAC motor 104 has four input signal ports commonly identified as "A HI", "A LOW", "B HI" and "B LOW", that are referenced respectively in FIG. 2 as 105a–105d. The IAC armature has an "A" coil winding 165 that connects between the "A HI" and A LOW" ports 105a and 105b; and also has a "B" coil winding 166 that connects between the "B HI" and "B LOW" ports 105c and 105d. These input ports 105a–105d, respectively, are normally coupled to ECM outlet ports C5, C6, C4 and C3 also identified in FIG. 2 as ports 103. As is well known, positive pulse signals from the ECM port C5 to the "A HI" input 105a and negative pulse signals from ECM port C3 to "B LOW" input 105d actuate the IAC armature 160 to step open and increase the bypass air flow (162) and thus advance the idle speed. Similarly, each positive pulse signal from ECM port C4 to "B HI" signal port 105c along with a negative pulse signal from ECM port C6 to "A LOW" cause the IAC armature to close the valve 161 one step to restrict bypass air and reduce engine idle speed.

Referring to FIG. 2, during diagnostic testing the conventional couplers 106, 106A between the ECM output and the IAC motor input ports are disconnected, and the couplers 107, 107A of the test apparatus 100 are attached thereto for interposing the tester in series, as described. The test apparatus 100 includes plural primary circuits 110, 112, 114, 116 which directly couple the ECM outputs C5, C6, C4 and C3, respectively, in series to the IAC motor inputs 105a–105d to retain the normal ECM pulse train connective and operative condition during the testing procedure. The test apparatus also includes plural secondary circuits constructed for testing the integrity of the primary circuits from the ECM 102 and operativeness of the IAC motor 104. These secondary circuits comprise a pair of similar circuits 120 and 122. Circuit 120 has a bipolar pair 124 of diodes D1 and D2 arranged in a connector line 126 that taps across pulsing circuits 114 and 116 for sending ECM pulses to the "B HI" and "B LOW" IAC motor signal ports 105c and 105d. The circuit 120 is a closed test loop in parallel with the series connection 114 and 116 which also form a closed loop through the "B" coil 166. A normally closed switch S1 is provided in the connector line 114 and is adapted to open both the series circuits to the "B HI" and "B LOW" ports 105c and 105d and the test circuit 120 for testing the integrity of the "B" coil circuit. A current limiting resistor R1 is serially connected in the "B" pulse train test circuit 120 to reduce the current magnitude to the diodes D1 and D2 to a minimum for protecting these diodes (as well as the ECM) and permitting substantially full power input to the IAC motor 104. The circuit 122 also has a bipolar pair 128 of diodes D3 and D4 arranged in connector 130 that taps across circuits 110 and 112 for carrying ECM pulses to the "A HI" and "A LOW" IAC motor signal ports 105a and 105b and thus forming a closed test loop in parallel with the series connectors 110 and 112 to the "A" coil 165. A normally closed switch S2 is provided in connector 110 for selectively opening the series circuits to the "A HI" and "A LOW" ports 105a and 105b as well as the test circuit 122 for the "A" coil circuit. A current limiting resistor R2 is serially connected in this "A" pulse train circuit 122 to protect the diodes D3 and D4. Thus, the tester 100 includes a number of paired indicator diodes D1, D2 and D3, D4 for indicating operativeness and faults in testing the IAC motor 104 and being arranged in parallel test circuits.

Test procedures for this particular embodiment of the invention exemplify the ease of operation of the testing apparatus 100. Such test procedures utilizing the apparatus 100 include checking the integrity of the "A" and "B" coil windings 165 and 166 and the idle speed compensation (i.e. IAC motor operation) in response to changing engine load conditions. Positive pulse signals from ECM outlet C5 to the "A HI" coil circuit will energize diode D4, positive pulse signals from outlet C4 to "B HI" will energize diode D1, negative pulse signals from ECM outlet C6 to "A LOW" will energize diode D3, and negative signals from outlet C3 to "B LOW" will energize diode D2. Since positive "A HI" and negative "B LOW" pulsing work together to open the IAC valve 161 for increasing bypass air flow and idle speed, the lighting of diodes D4 and D2 will indicate this transition and increasing idle speed should be discernible. Similarly, positive "B HI" and negative "A LOW" pulses from the ECM 102 should light diodes D1 and D3 to indicate IAC valve closing and reduced idle speed. If only one LED diode is lighted, such as D2 is on and D4 is off, then the apparatus 100 diagnoses three possible faults: (a) a bad connection or broken wire in the C5 to "A HI" connection, (b) the "A" coil 165 winding is bad or (c) the ECM circuit is bad. Thus, the operator can quickly isolate the fault. Other quick and reliable diagnostic testing can be performed by running the engine at idle, and selectively loading and unloading the engine, such as by turning the A.C. on and off or selectively or sequentially disconnecting fuel injectors or the like.

In performing certain diagnostic tests of the IAC motor 104, it should be understood that the use of a conventional tachometer (not shown) to obtain accurate readings of the idle speed rpm is generally recommended, and that a conventional assembly line diagnostic link (ALDL), shown at 168 in FIG. 2, is also useful for certain tests involving the IAC motor 104. As previously described, the ECM 102 commands the IAC valve 161 to be reset to a "fast idle" position when the ignition is turned off. For certain test purposes, as when the idle speed is consistently too high, it may be necessary to manually set the throttle plate 163 to provide a minimum air flow rate after first taking a tachometer reading. In order to adjust the air flow rate, the ECM 102 must be disconnected from the IAC motor 102 or else the ECM will continue to change the IAC valve position to compensate for changes in the throttle plate air delivery. Therefore, with the engine off and the switches S1 and S2 closed, the ALDL 168 is connected across the automotive system factory terminals therefor with the result that all relays, solenoids, lights and fans are energized and the ECM 102 commands the IAC valve 161 to be fully seated and diodes D1 and D3 should be lighted as "B HI" and "A LOW" are pulsed to perform this function. The ALDL 168 is now switched off (or removed) and the switches S1 and S2 are opened before the engine is started. With the engine on, the operator can now adjust the throttle plate 163 to provide a minimum air flow rate. In the case of a vacuum leak resulting in an uncontrollable idle condition, when the switches S1 and S2 are closed and the engine is restarted, the idle speed will not change; but if the fault is not a vacuum leak, the rpm should drop at least 200 rpm.

The testing apparatus may also be used to perform an ECM shutdown test as when the idle speed is either too high or too low. With the apparatus 100 coupled between the ECM 102 and IAC motor 104, the engine is shut off which should result in all of the diodes D1–D4 flashing and then only two corresponding diodes (D1, D3 or D2, D4) being lit as the IAC valve 161 is moved to its restart "fast idle" position. At the time that the IAC valve is reset in its restart position, the ECM will send opposing commands to the "A" and "B" coils 165,166 to thereby lock or hold the IAC valve in position. This results in the brief lighting of both "A HI" and "B HI" diodes or both "A LOW" and "B LOW" diodes. After a few seconds (i.e. 20–30), all diodes should be off indicating that the valve 161 has been positioned and the ECM has shut down. If both the "A HI" and "B HI" diodes D4 and D1 or both the "A LOW" and "B LOW" diodes D3 and D2 remain on, three possible faults may exist: (a) the ECM is faulty, (b) there is a short in the ECM to IAC motor connections or (c) there is a short in either the "A" or "B" IAC coil windings 165 or 166. When the engine idle speed is stable and no IAC motor pulsing is taking place, the diodes will not be lighted (unless there is a fault and both "HI" diodes D1, D4 or both "LOW" diodes D2, D3 stay on) and the opening and closing of the switches S1 and S2 should not produce any test circuit response.

Referring now to FIGS. 3 and 4, another embodiment of the diagnostic apparatus 300 is shown interposed between one output 303 (103B) of the ECM 302 (102) and signal ports 308 to a sequential fuel injection (SFI) device 304. The SFI is normally controlled by the ECM 302 through the timed sequential closing of internal circuit-closing means such as switches (not shown). For disclosure purposes, a six injector system is shown having fuel injectors 331–336, one for each cylinder of the automobile and which are pulsed one at a time in the same predetermined order as the spark plugs (not shown) are fired. Although well understood in the automotive trade, a brief description is given for environmental purposes. Each fuel injector (331–336) is basically a solenoid-operated pintle valve (not shown) carried on an armature operated by a solenoid winding (INJ 1–INJ 6) to open the valve and inject a fuel mix into the cylinder bore. The "hot side" includes a lead wire 305 providing common power circuit through a 15 amp fuse 338 from ignition 339, and the pulsing circuit includes series connector lines coupling the fuel injectors 331–336 to the ECM circuit closing means and thence to ground. The sequential making and breaking of these ground connections by the ECM pulses the fuel injectors—the duration of each switch closing (grounding) being known as pulse width and determines how much fuel is sprayed into the intake valve port for each sequential firing. It is important that each fuel injector provide the same amount of fuel. If a drivability symptom such as erratic engine speed or the like appears to indicate unequal injection, then a fuel injector balance test should be performed.

Referring to FIG. 4, the diagnostic testing apparatus 300 for performing a simple power balance test on a sequential fuel injection system 304 requires a separate test circuit for each injector. Thus, in the embodiment shown for the six injector system 331–336, the test device 300 provides a series flow circuit for this system including a common series circuit connector line 310 coupling the ignition 339 to the common input connector 305 and separate pulse or signalling connectors 341–346 coupling the respective injectors 331–336 to the ECM 302. In addition to the series circuits 341–346 of the tester 300 for establishing normal operative connection between the ECM 302 and sequential fuel injectors 304, the test apparatus 300 includes parallel test circuits 361–366 having light emitting diodes 371–376 and current limiting resistors 381–386, respectively. Each of these test circuits 361–366 and their respective series circuit connectors 341–346 is provided with a manual normally closed switch 351–356 for selectively disabling the individual fuel injectors during part of the test procedure. The six cylinder test apparatus 300 may be adapted for testing a four cylinder fuel injection system (not shown). For this purpose, a double pull/throw switch 390 may be interposed in two of the parallel test circuits, such as 365 and 366.

During testing procedures, the operator can selectively disable any of the fuel injectors INJ 1–INJ 6 by opening the associated switch 351–356 thereto during the continued normal firing sequencing controlled by the ECM 302. A decrease in rpm of the engine can then be measured or detected and any faulty fuel injector is quickly located.

The embodiments of the diagnostic testing apparatus 100, 300 are given by way of example for disclosure purposes, and the invention is only to be limited by the scope of the claims which follow.

I claim:

1. A diagnostic testing apparatus for testing the operation of an automotive idle air control (IAC) motor having a pair of operating circuits with positive and negative input signal ports and plural stepper positions for regulating engine idle speed, said operating circuits normally being directly connected to an electronic control module (ECM) of the automotive electrical system and being power controlled only by the ECM, comprising:

first means including coupling means for removably coupling said testing apparatus between the ECM and the operating circuits of IAC motor to be tested, and further including first circuit means constructed and arranged for re-establishing normal series power control connection of the ECM with each of the IAC motor operating circuits; and second means comprising a plurality of testing circuits, each of which connects across one of the power control connections of the first circuit means in parallel with the associated operating circuit of the IAC motor, each testing circuit being responsive to the ECM power control to the associated operating circuit and including at least one indicator device for indicating an operating condition of the associated operating circuit.

2. The system of claim 1 wherein each indicator device comprises a light emitting diode.

3. The testing apparatus of claim 1 wherein the indicator devices of the testing circuits comprise bipolar pairs of light emitting diodes for indicating faults occurring in the IAC motor, each diode corresponding to one of the signal ports, and wherein the ECM pulse train signals to the signal ports normally energize the respective diodes associated therewith.

4. The testing apparatus of claim 3 wherein the testing circuits further comprise a current limiting resistor connected in series with each bipolar pair of diodes to restrict pulse current flow to a predetermined minimum value.

5. The apparatus according to claim 1, which includes switch means constructed and arranged for selectively disabling at least one of the testing circuits.

6. The testing apparatus of claim 1 wherein the operating circuits comprise a pair of IAC coil windings having at least two bypass air control positions responsive to different pulse train signals generated through the first circuit means by the ECM, and wherein the second means includes a testing circuit associated with each power control connection of the first circuit means including different indicator means for indicating the integrity of the air control positions.

7. The testing apparatus of claim 6 including means for accommodating adjustment of the engine idle speed to a desired level for testing, and comprising at least one switch for each testing circuit and its associated first circuit means.

8. A diagnostic testing apparatus for testing the circuit integrity of an idle air control (IAC) motor having a pair of operating circuits with positive and negative signal ports and at least two bypass air control positions and being controlled in its normal operation in response to different pulse train signals generated at the signal ports by an electronic control module (ECM) of the automotive electrical system, said testing apparatus comprising:

coupling means for removably coupling said testing apparatus between the ECM and the operating circuits of the IAC motor to be tested and including first circuit means for re-establishing normal series pulse train circuit connections of the ECM to the signal ports of said IAC motor operating circuits, and second means constructed and arranged to provide a testing circuit associated with the series circuit connections of the ECM to each signal port of the operating circuits, each testing circuit being connected across the first circuit means in parallel with an operating circuit of the IAC motor and being responsive to the pulse train signals of the ECM to such associated operating circuit, and each testing circuit including an indicator device for indicating an operating condition in the IAC motor.

9. A diagnostic testing apparatus for testing the operation of the idle air control (IAC) system in an automotive engine where the idle speed is set by a two-coil stepper motor having two IAC coil circuits, the normal operation of which is activated in response to power pulse signals generated by an electronic control module (ECM) of the automotive electrical system, the IAC system being normally directly connected to and power controlled by the ECM, said testing apparatus comprising:

coupling means for removably coupling said testing apparatus between the ECM and the IAC coil circuits to be tested and including first circuit means constructed and arranged for re-establishing normal series power control connections of the ECM to each IAC coil circuit;

second means constructed and arranged to provide a plurality of testing circuits, each of which connects across the first circuit means in parallel with at least one associated IAC coil circuit, each testing circuit being responsive to the ECM power control to the associated IAC coil circuit and including at least one indicator device for indicating an operating condition of such IAC coil circuit; and switch means constructed and arranged for selectively disabling or connecting the ECM power pulse signals from the individual IAC coil circuits, each switch means controlling the series power control connection to one of the IAC coil circuits and the associated testing circuit.

10. A diagnostic testing apparatus for testing the circuit integrity of an idle air control (IAC) system in an automotive engine wherein the idle speed is set by a two-coil stepper motor having two IAC stepper coil circuits associated plural signal ports, the normal operation of the IAC stepper coil circuits being activated in response to power pulse signals generated by an electronic control module (ECM) of the automotive electrical system and the IAC stepper coil circuits being normally directly connected to and power controlled only by the ECM, said testing apparatus comprising:

coupling means for removably coupling said testing apparatus between the ECM and the IAC stepper coil circuits to be tested and including first circuit means for re-establishing a normal series power control connection of the ECM to the associated signal ports of each IAC stepper coil circuit; and second means constructed and arranged to provide a plurality of testing circuits, each of which connects across one power control connection of the first circuit means in parallel with an associated IAC stepper coil circuit, each testing circuit being responsive to the power control of the ECM to the associated IAC stepper coil circuit and including at least one light emitting diode with an associated current limiting resistor for indicating the integrity of the IAC stepper coil circuit; and switch means constructed and arranged for selectively disabling or connecting the ECM power pulse signals from the individual IAC stepper coil circuits, each switch means controlling the series power control connection to one of the IAC stepper coil circuits and the associated testing circuit.

* * * * *